(12) United States Patent
Rupich et al.

(10) Patent No.: US 7,902,120 B2
(45) Date of Patent: Mar. 8, 2011

(54) HIGH TEMPERATURE SUPERCONDUCTORS HAVING PLANAR MAGNETIC FLUX PINNING CENTERS AND METHODS FOR MAKING THE SAME

(75) Inventors: Martin W. Rupich, Framingham, MA (US); Wei Zhang, Shrewsbury, MA (US); Yibing Huang, Northborough, MA (US); Xiaoping Li, Westborough, MA (US)

(73) Assignee: American Superconductor Corporation, Devens, MA (US)

( * ) Notice: Subject to any disclaimer, the term of this patent is extended or adjusted under 35 U.S.C. 154(b) by 667 days.

(21) Appl. No.: 11/880,533

(22) Filed: Jul. 23, 2007

(65) Prior Publication Data

US 2008/0153709 A1 Jun. 26, 2008

Related U.S. Application Data

(60) Provisional application No. 60/832,871, filed on Jul. 24, 2006.

(51) Int. Cl.
*H01B 12/00* (2006.01)
*H01B 13/00* (2006.01)

(52) U.S. Cl. .............. 505/500; 505/230; 505/231; 505/237; 505/238; 505/430; 505/431; 505/482; 505/742; 428/701; 428/702; 428/930; 174/125.1; 29/599

(58) Field of Classification Search ......... 505/230–231, 505/430–431, 450, 482, 500; 174/125.1; 29/599; 428/699–702
See application file for complete search history.

(56) References Cited

U.S. PATENT DOCUMENTS 5,231,074 A 7/1993 Cima et al.

(Continued)

FOREIGN PATENT DOCUMENTS

WO WO-99/16941 4/1999

(Continued)

OTHER PUBLICATIONS

Specht, E.D. et al., "Stacking faults in YBa2Cu3O7-x: Measurement using x-diffraction and effects on critical current," Applied Physics Letters, vol. 89, p. 162510, 2006.

(Continued)

*Primary Examiner* — Stanley Silverman
*Assistant Examiner* — Kallambella Vijayakumar
(74) *Attorney, Agent, or Firm* — Occhiuti Rohlicek & Tsao LLP

(57) ABSTRACT

Superconductor wires or layers having improved properties and methods for making the same are described. The superconducting layer includes a rare earth element-alkaline earth element-transition metal oxide having an average stacking fault density that is greater than about 0.01 nm$^{-1}$, wherein two or more rare earth cations form the rare earth element. To form the superconductor layer of the present invention, a layer having a rare earth element-alkaline earth element-transition metal oxide substantially in a first crystal structure can be provided to a substrate where two or more rare earth cations form the rare earth element. The layer can then be heated at a temperature that is greater than 550° C. under oxidizing conditions to form a high-temperature superconducting layer substantially in a second crystal structure.

40 Claims, 15 Drawing Sheets

U.S. PATENT DOCUMENTS

| | | | |
|---|---|---|---|
| 6,022,832 | A | 2/2000 | Fritzemeier et al. |
| 6,027,564 | A | 2/2000 | Fritzemeier et al. |
| 6,190,752 | B1 | 2/2001 | Do et al. |
| 6,436,317 | B1 | 8/2002 | Malozemoff et al. |
| 6,537,689 | B2 | 3/2003 | Schoop et al. |
| 6,569,811 | B1 * | 5/2003 | Shi .................... 505/400 |
| 6,624,122 | B1 * | 9/2003 | Holesinger et al. .......... 505/125 |
| 6,716,545 | B1 * | 4/2004 | Holesinger et al. .......... 428/701 |
| 6,797,313 | B2 | 9/2004 | Fritzemeier et al. |
| 6,974,501 | B1 | 12/2005 | Zhang et al. |
| 2004/0192559 | A1 | 9/2004 | Araki et al. |
| 2005/0043183 | A1 * | 2/2005 | Chan .................... 505/100 |
| 2005/0159298 | A1 | 7/2005 | Rupich et al. |
| 2006/0040829 | A1 | 2/2006 | Rupich et al. |
| 2006/0040830 | A1 | 2/2006 | Thieme et al. |
| 2006/0073975 | A1 | 4/2006 | Thieme et al. |
| 2006/0073979 | A1 | 4/2006 | Thieme et al. |
| 2006/0094603 | A1 * | 5/2006 | Li et al. .................... 505/445 |
| 2007/0111893 | A1 | 5/2007 | Kodenkandath et al. |
| 2007/0179063 | A1 | 8/2007 | Malozemoff et al. |

FOREIGN PATENT DOCUMENTS

| | | |
|---|---|---|
| WO | WO-99/17307 | 4/1999 |
| WO | WO-99/58415 | 11/1999 |
| WO | WO-00/58044 | 10/2000 |
| WO | WO-00/58530 | 10/2000 |
| WO | WO-01/08169 | 2/2001 |
| WO | WO-01/08170 | 2/2001 |
| WO | WO-01/08231 | 2/2001 |
| WO | WO-01/08232 | 2/2001 |
| WO | WO-01/08233 | 2/2001 |
| WO | WO-01/08235 | 2/2001 |
| WO | WO-01/08236 | 2/2001 |
| WO | WO-01/11428 | 2/2001 |
| WO | WO-01/15245 | 3/2001 |
| WO | WO-01/26164 | 4/2001 |
| WO | WO-01/26165 | 4/2001 |
| WO | WO-02/35615 | 5/2002 |
| WO | WO-2005/007576 | 1/2005 |
| WO | WO-2005/081710 | 9/2005 |
| WO | WO-2005/121414 | 12/2005 |
| WO | WO-2006/021003 | 2/2006 |
| WO | WO-2006/023826 | 3/2006 |
| WO | WO-2006/121299 | 11/2006 |

OTHER PUBLICATIONS

Shoup, S.S. et al., J. Am. Cer. Soc., vol. 81, 3019-3021, 1998
Beach, D. et al., Mat. Res. Soc. Symp. Proc., vol. 495, 263 (1988).
Paranthaman, M. et al., Superconductor Sci. Tech., vol. 12, 319 (1999).
Lee, D.J. et al., Japanese J. Appl. Phys., vol. 28, L178 (1999).
Rupich, M.W. et al., I.E.E.E. Trans. on Appl. Supercon. vol. 9, 1527-1530, 1999.
Rupich M. W. et al., MRS Bulletin, Pittsburgh, US, vol. 29, No. 8 (Aug. 1, 2004).

* cited by examiner

HIGH TEMPERATURE SUPERCONDUCTORS HAVING PLANAR MAGNETIC FLUX PINNING CENTERS AND METHODS FOR MAKING THE SAME

CROSS-REFERENCE TO RELATED APPLICATIONS

The present application claims the benefit of the filing date of U.S. Provisional Patent Application No. 60/832,871, filed Jul. 24, 2006, the content of which is hereby incorporated by reference herein in its entirety.

STATEMENT REGARDING FEDERALLY SPONSORED RESEARCH OR DEVELOPMENT

The present invention was made with United States government support under Subcontract Grant No. 4000026954 awarded by the Oak Ridge National Laboratory and under Contract No. F33615-03-C-5504 awarded by the United States Air Force/Air Force Research Laboratory. The United States government may have certain rights in this invention.

FIELD OF THE INVENTION

The present invention relates generally to enhancing critical current density carrying capacity of superconducting materials. The present invention also relates to superconducting structures and to methods of improving superconducting properties of rare earth-alkaline earth-transition metal oxide superconductors.

BACKGROUND

Since the discovery of high-temperature superconducting (HTS) materials (material that can retain its superconducting properties above the liquid nitrogen temperature of 77 K) there have been efforts to research and develop various engineering applications using such HTS materials. In thin film superconductor devices and wires, most progress has been made with fabrication of devices utilizing an oxide superconductor including yttrium, barium, copper and oxygen in the well-known basic composition of $YBa_2Cu_3O_{7-y}$ (hereinafter referred to as Y123 or YBCO) which remains the preferred material for many applications, including cables, motors, generators, synchronous condensers, transformers, current limiters, and magnet systems for military, high energy physics, materials processing, transportation and medical uses.

Even though Y123 is the material of choice for HTS applications, improvements in critical current density, in particular, critical current density in high magnetic fields and temperatures ($J_c(H,T)$), would reduce application costs, and reduce the size and weight of the system. Hence, it has been important to continue to improve the performance of Y123 superconductors.

One method to achieve such improvements includes "pinning" of the superconducting vortices, which is thought to be the underlying mechanism for high critical current density $J_c$ in HTS materials. To achieve pinning in superconductors, matching the local potential energy differences as closely as possible to the size of the normal core of the superconducting flux line or vortex have been attempted. It is generally thought that the cross-sectional core has a size on the order of the coherence length (which is several nanometers in high temperature superconducting cuprates and grows with temperature). Moreover, it is thought that critical currents in polycrystalline high-temperature superconductors are still further reduced by weak links at the grain boundaries, which are made worse by high porosity, misalignment of the crystalline axis of adjacent grains, and by formation and accumulation of non-superconductor phases (compounds) at boundaries between superconducting grains.

There have been efforts to improve flux pinning of bulk superconducting materials. For example, the superconducting properties of $YBa_2Cu_3O_{7-x}$ compounds with partial substitutions with europium (Eu), gadolinium (Gd), and samarium (Sm) were found to show a slight improvement in intragrain $J_c$ (flux pinning). The doping of $YBa_2Cu_3O_{7-x}$ with a wide range of dopants at the Y, Ba and Cu sites were also reported. Increased density of twin boundaries was also reported to provide only moderate improvement in flux pinning. Some increase in $J_c$ in $YBa_2Cu_3O_{7-x}$ was achieved by the introduction of point defects by neutron irradiation.

In attempting to form thin films of Y123 compositions with enhanced flux pinning, yttrium-based impurities such as $Y_2O_3$ and $Y_2BaCuO_5$ (Y211) in Y123 thin films have been formed. Moreover, a multilayer thin film superconducting composition having alternating layers of two rare earth materials, (RE)123, was also reported. Lastly, RE-123 thin films containing a mixture of rare earth elements was also reported.

SUMMARY

High temperature superconductors having planar magnetic flux pinning centers are described. In certain embodiments, a method for forming a superconducting layer is provided. The method can include providing a layer, which includes a rare earth element (RE)-alkaline earth-transition metal oxide substantially in a first crystal structure. In certain embodiments, the RE can include two or more rare earth cations. The method can further include heating the layer at a temperature that is greater than 550° C. under oxidizing conditions to form a high-temperature superconducting (HTS) layer substantially in a second crystal structure.

In certain embodiments, a superconducting wire is provided. The superconducting wire can include a substrate having a superconducting layer disposed thereon, where the superconducting layer can include a rare earth element (RE)-alkaline earth element-transition metal oxide having an average stacking fault density that is greater than about 0.01 nm$^{-1}$. In certain embodiments, the RE can include two or more rare earth cations.

In certain embodiments, a superconducting layer is provided. The superconducting layer can be produced by providing a layer which includes a rare earth element (RE)-alkaline earth element-transition metal oxide substantially in a first crystal structure; and heating the layer at a temperature that is greater than 550° C. under oxidizing conditions to form a high-temperature superconducting (HTS) material substantially in a second crystal structure. In certain embodiments, the RE can include two or more rare earth cations and the HTS material can have an average stacking fault density that is greater than about 0.01 nm$^{-1}$.

BRIEF DESCRIPTION OF THE DRAWING

The disclosure makes reference to the following drawings, which are presented for the purpose of illustration only and are not intended to be limiting of the invention.

DETAILED DESCRIPTION

High temperature superconductors (HTS) having magnetic flux pinning centers are described. The magnetic flux pinning center can be a planar defect, such as stacking faults, and other pinning centers, such as dislocations, atomistic defects created by elemental substitution, and nanometer-sized particles created by second phases in the HTS. HTS made in accordance with certain embodiments can provide HTS having significantly improved critical currents.

Figure 1:
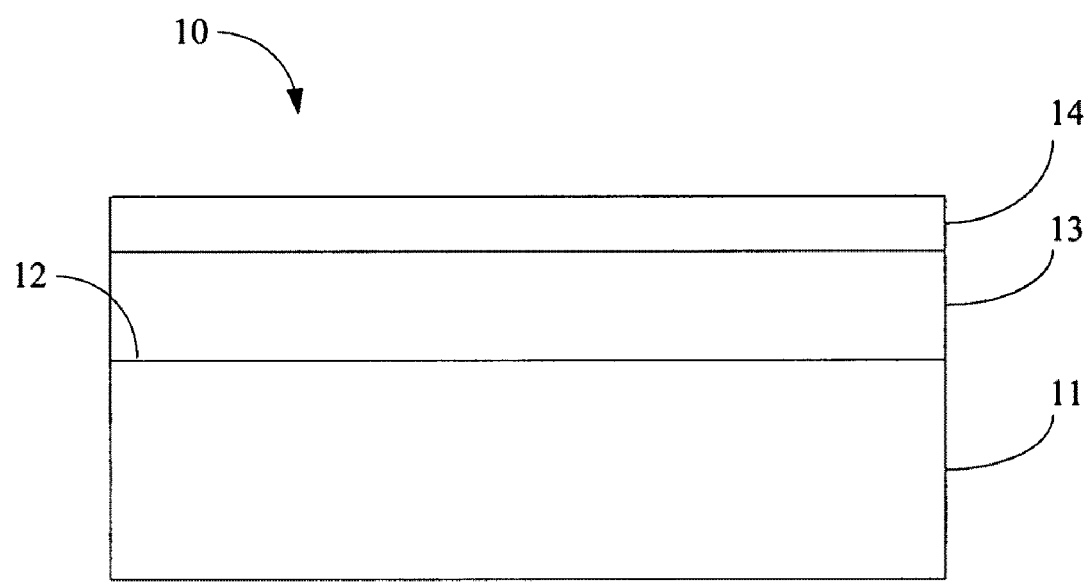
FIG. 1 is a schematic representation of a superconducting layer in accordance with certain embodiments of the present invention.

Referring to one embodiment shown in FIG. 1, high temperature superconductor (HTS) articles such as 10, particularly in the form of wires or tapes, can generally include at least one biaxially-textured substrate 11 with surface 12, at least one buffer layer 13, and a top layer of in-plane aligned superconducting layer of a rare earth-alkaline earth-transition metal oxide superconductor (RE-123) 14. Although the methods and compositions described herein apply generally to all RE-123 superconductors, the methods and articles are illustrated with reference to YBCO.

Substrate 11 can be made of a metal such as Ni, Ag, or Ni alloys and can provide flexibility for the article. Substrate 11 can be fabricated over long lengths and large areas. Buffer layer 13 can be an epitaxial buffer layer and can me made of metal oxides, such as $LaAlO_3$, $Y_2O_3$, $CeO_2$, or yttria-stabilized zirconia (YSZ). The buffer layer(s) 13 can be more resistant to oxidation than the substrate and can reduce the diffusion of chemical species between the substrate and the superconductor layer. Buffer layer 13 can also serve as chemical barriers between substrate 11 and the layer 14. Moreover, the buffer layer(s) 13 can have a coefficient of thermal expansion that is well matched with the superconductor material of layer 14.

As described above, layer 14 can be an in-plane aligned superconducting layer of RE-123 (e.g., YBCO). For example, YBCO can be biaxially textured wherein the c-axis of the orthorhombic crystal cell is parallel to the thickness direction of the HTS article and the ab-plane is perpendicular to the thickness direction of the HTS article. Or stated in a different way, the c-axis is perpendicular to the plane of the YBCO film and ab-plane is in the plane of YBCO film.

Figure 2:
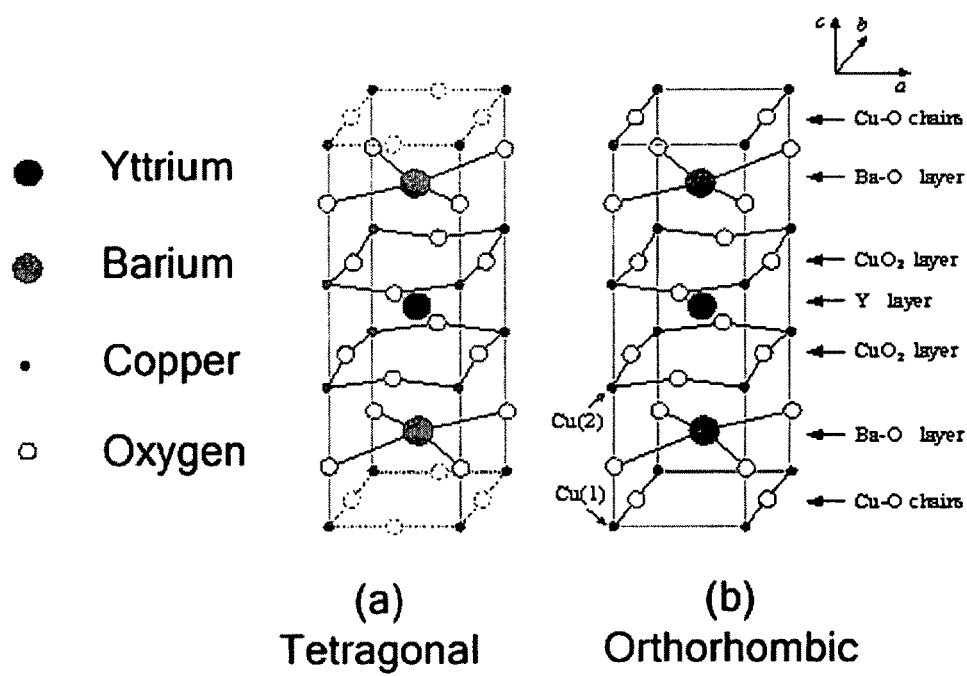
FIG. 2 is a schematic representation of the crystal structures of YBCO in accordance with certain embodiments of the present invention.
Figure 15:
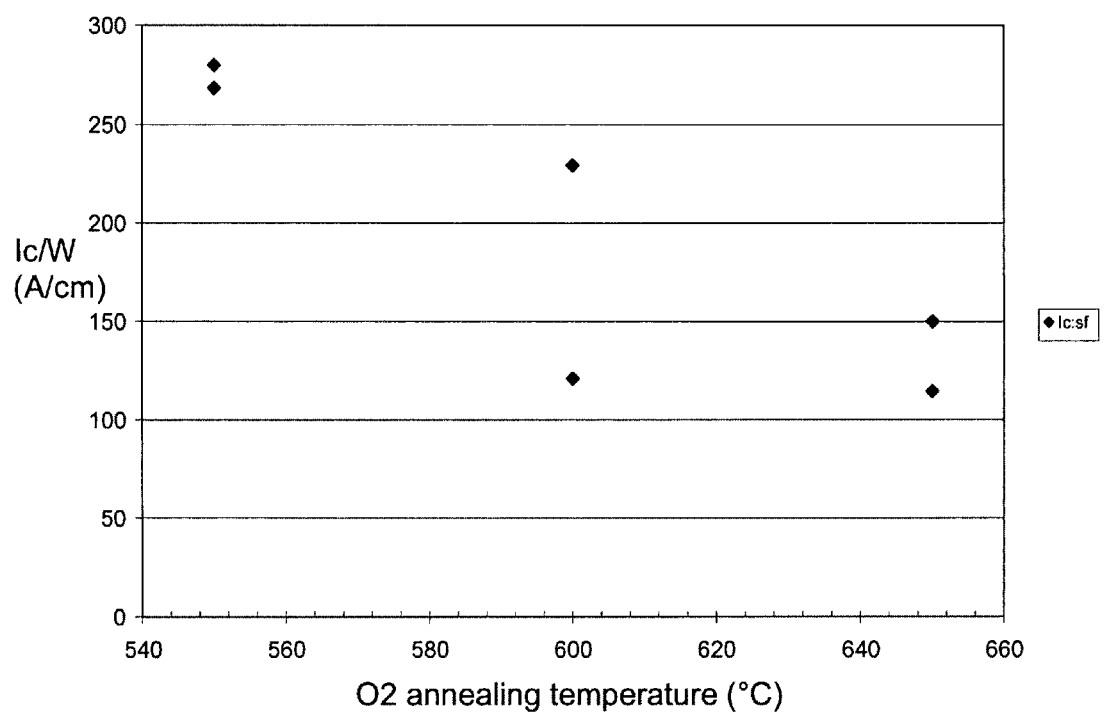
FIG. 15 shows a plot of the self-field critical current density (Ic:sf) of YBCO as a function of oxygen annealing temperatures.

As shown in FIG. 2, the YBCO has a perovskite structure having either tetragonal or orthorhombic symmetries, depending on the amount and distribution of oxygen in the top and bottom Cu—O layers which close the unit cell. Generally, many of the processes to obtain YBCO result in a poorly oxygenated structure having a tetragonal symmetry, which is not superconducting. In the tetragonal symmetry, the oxygen concentration is low and the oxygen atoms randomly disperse in their four possible sites between Cu in the top and bottom planes (see (a) in FIG. 2). Hence, YBCO is generally oxygenated to obtain a superconducting orthorhombic phase. In the orthorhombic phase, the oxygen atoms arrange themselves in a more ordered fashion into the inter-Cu sites along the b-axis of the top and bottom planes (see (b) in FIG. 2). In order to achieve a material with optimum oxygen content in the orthorhombic phase, YBCO is heated from about 400 to 550° C. in an oxygen rich environment. However, temperatures exceeding 550° C. are not utilized during the oxygenation step because decomposition of the YBCO occurs, leading to decreased critical currents. For example, FIG. 15 shows that the self-field critical current density of YBCO decreases when the oxygenation step is carried out at 600° C. and 650° C.

Figure 3:
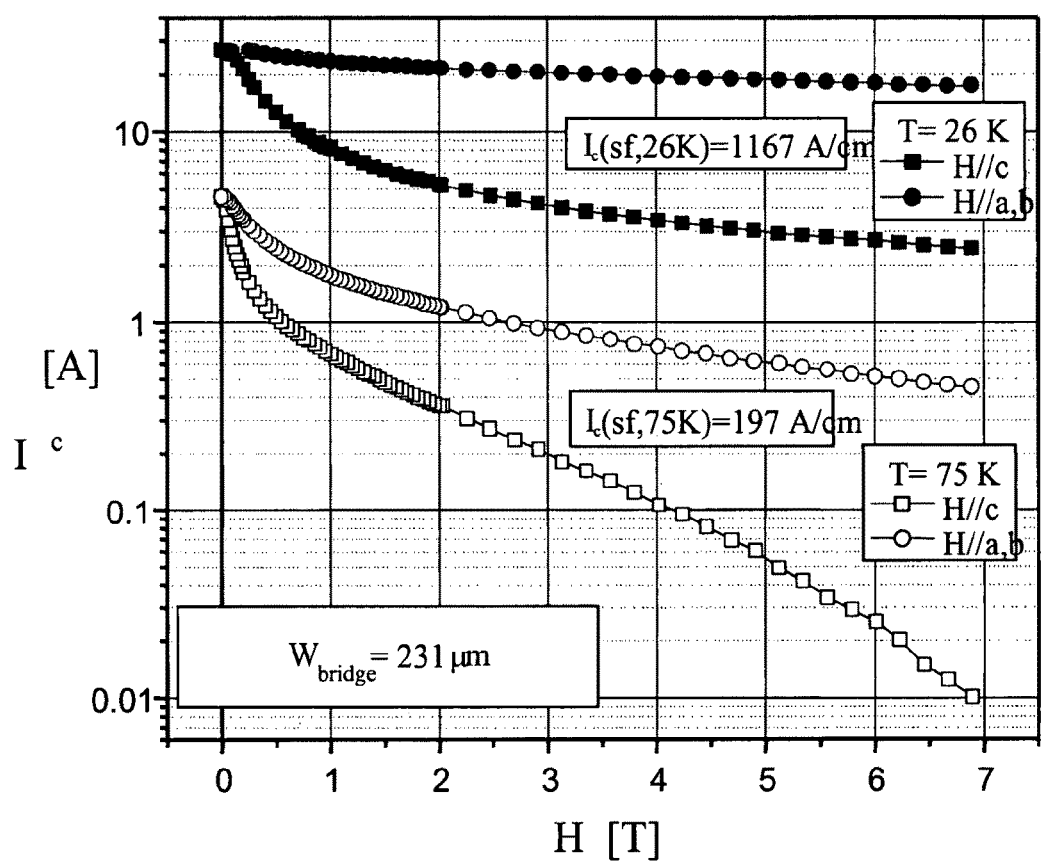
FIG. 3 illustrates the Ic dependence of Y123 (YBCO) superconductor formed on an oxide-buffered metal substrate as a function of magnetic field and temperature.

FIG. 3 shows the typical field dependence of a metal-organic deposited (MOD) YBCO film on an oxide-buffered metal substrate having an HTS layer that is oriented with its ab-plane parallel to the film surface with magnetic field oriented parallel to the planar face of the film (H//ab) and with magnetic field oriented parallel to the c-axis of the film (H//c). At 75K, with the magnetic field oriented perpendicular to the planar face of the film (H//c), there is a significant decrease in critical current (Ic) from the value in parallel orientation (H//ab), limiting the usefulness of the Y123 wires in many coil applications. Although the performance improves as the temperature is lowered, many anticipated applications are planned for temperatures in the 55 to 65K region in magnetic fields of 1-3 Tesla oriented perpendicular to the planar face of the film, which are conditions at which performance drops significantly.

Figure 4:
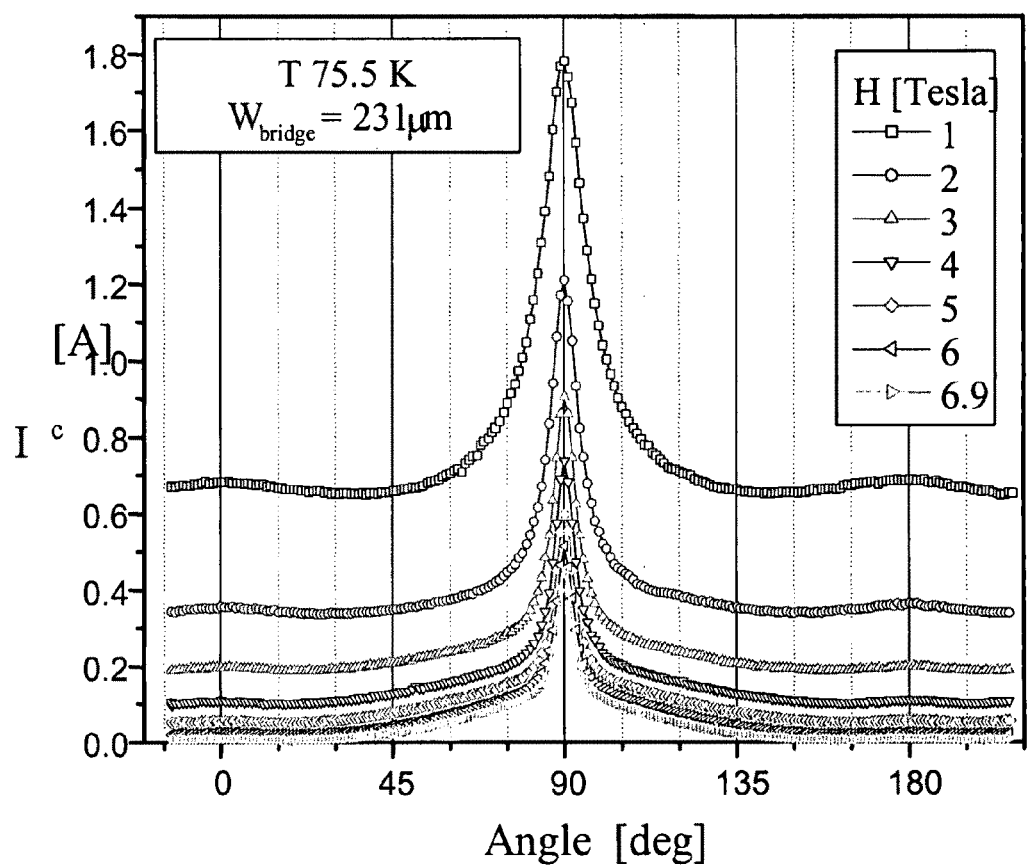
FIG. 4 illustrates Ic as a function of field orientation of a YBCO superconductor on an oxide-buffered metal substrate.

In addition to the parallel and perpendicular performance of the YBCO wires in magnetic field, it is important to examine the field performance at intermediate angles as shown in FIG. 4. In FIG. 4, 90° refers to the Ic measured where the magnetic fields are oriented parallel to the ab-plane of the YBCO(H//ab). Hence, 0° and 180° refer to the Ic measured where the magnetic fields are oriented parallel to the c-axis of the YBCO(H//c). As shown in FIG. 4, YBCO films exhibit a large peak when magnetic fields are parallel to the ab-plane (H//ab or 90°) and exhibit small peaks when magnetic fields are parallel to the c-axis (H//c or 0 and 180°).

Figure 5:
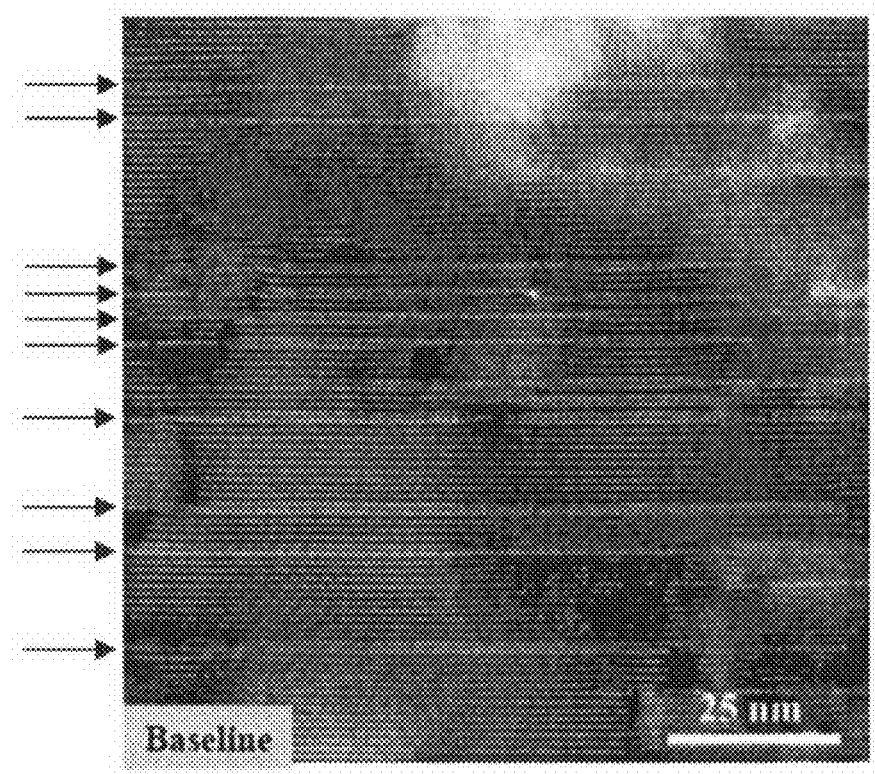
FIG. 5 shows transmission electron microscope image of Y-123 having Y-124 type intergrowths.
Figure 6:
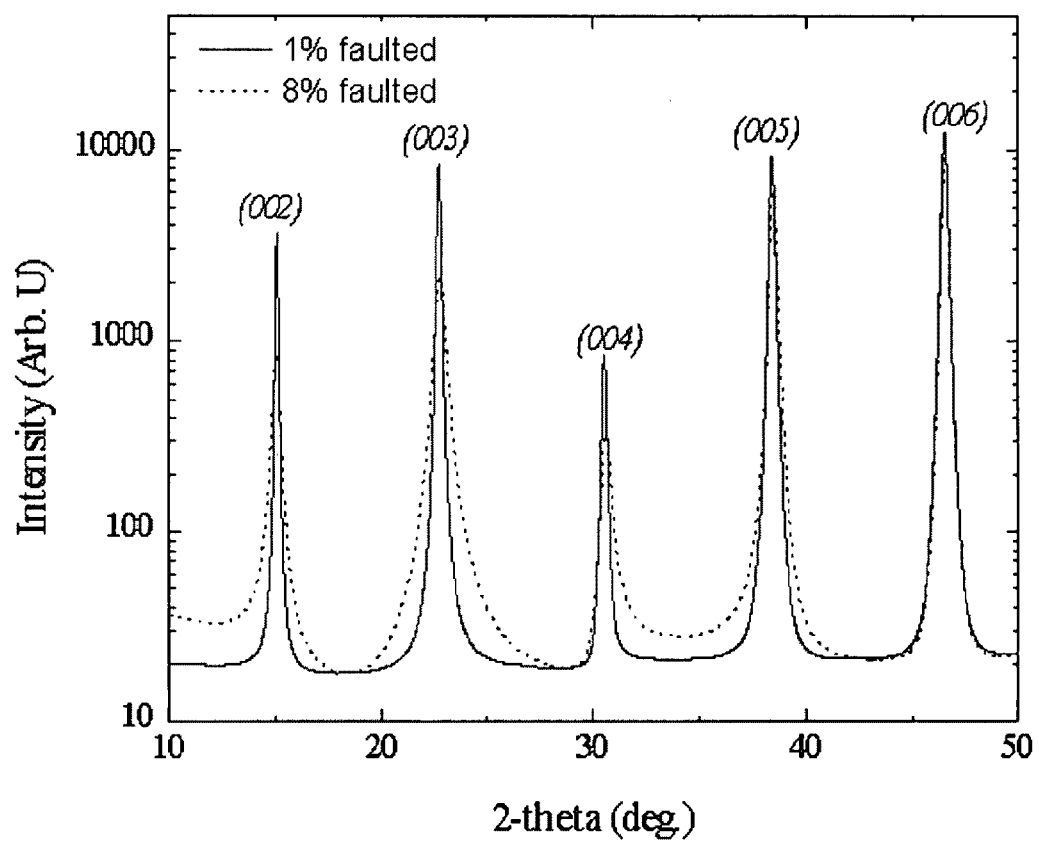
FIG. 6 illustrates simulated peaks with 1% stacking faults (shown as solid line) and simulated peaks with 8% stacking faults (shown as dotted line) in accordance with certain embodiments of the present invention.

While not wishing to be bound by theory, it has been conjectured that the strong peak observed when H//ab is associated with the formation of $YBa_2CU_4O_{8-z}$ type (Y124-type) intergrowths (stacking faults) in the Y123 layer that arise during the oxygenation step (see FIG. 5 where the bright linear regions, some of which are highlighted with arrows, are Y124-type stacking faults). Although the precise mechanism for their formation is not fully understood, TEM shows the intergrowths typically have an average spacing of about 15 to 20 nm, which can be confirmed by XRD utilizing peak broadening models fitted to a Hendricks-Teller model as shown in FIG. 6 (see E. D. Specht, A. Goyal, J. Li, P. M. Martin, X. Li, and M. W. Rupich, "Stacking faults in $YBa_2Cu_3O_{7-x}$: Measurement using x-diffraction and effects on critical current," *Applied Physics Letters*, Vol. 89, p. 162510, 2006, which is incorporated by reference herein in its entirety). As shown, broadening of the peaks in the x-ray diffraction patterns (broadening of the solid lines to dotted lines) correspond to an increase in the stacking fault density.

In addition to examining performance at all angles and not just in the fields of H parallel to the plane face of the tape or the a-b plane of the Y123 (H//ab) or perpendicular to the plane face of the tape or a-b plane of the Y123 (H//c), a number of factors are relevant to improving pinning in the RE-123 coated conductor articles. For example, pinning effects are known to be temperature and field dependent and thus can be optimized for the working temperature and magnetic field. Moreover, absolute, rather than just relative, total current $I_c$ per tape width (i.e., A/cm-width) performance should be optimized under working temperatures and fields.

Enhanced pinning can come from pinning centers, including dislocations created around particulate defects, atomistic defects created by elemental substitutions, and nanometer-sized particles or "nanodots" created by second phases in the RE-123 material, e.g., within the crystalline grains of the oxide superconductor. The nature of the defects can produce improved pinning of the magnetic flux in selective field orientation angles. Ideally, the pinning is isotropic, resulting in improved flux pinning at all angular orientations of the magnetic field.

Figure 7:
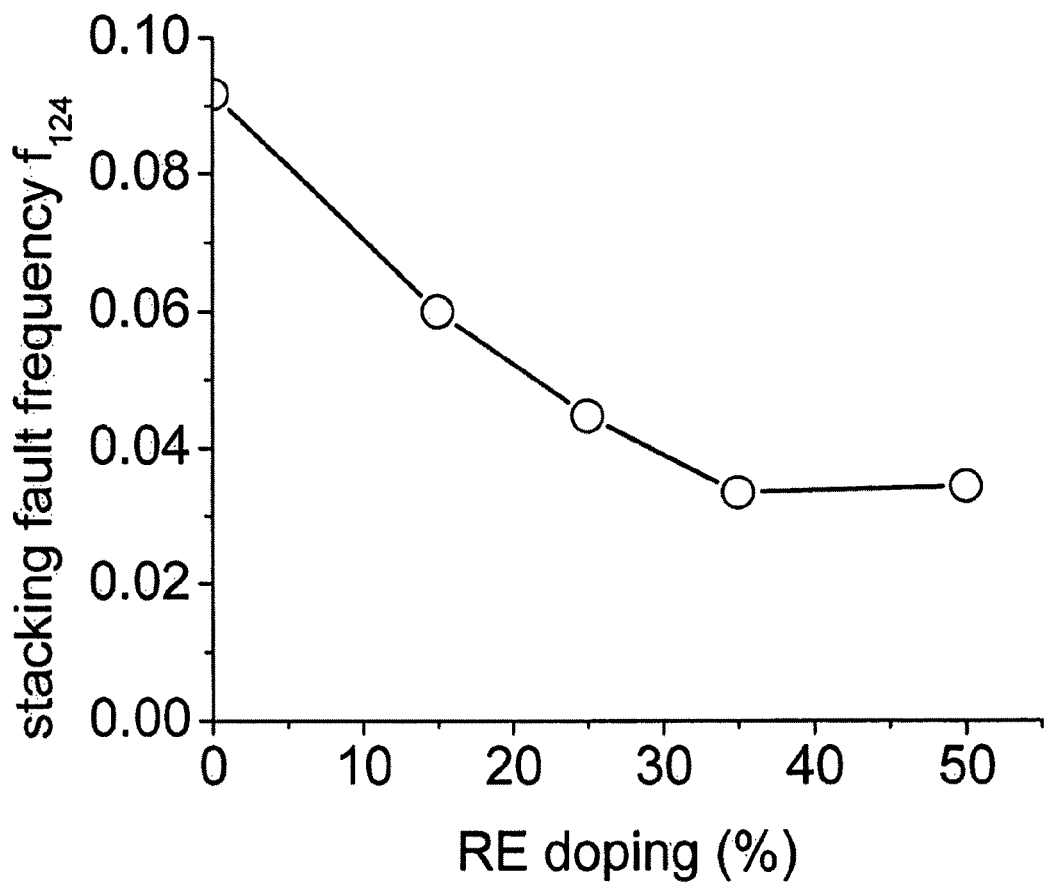
FIG. 7 illustrates the decrease in stacking fault density as a function of rare earth elements added in a stoichiometric excess.

For example, improvements in properties are observed by the inclusion of rare earth dopants in YBCO as described in U.S. Publication No. 2005-0159298, which is hereby incorporated by reference herein in its entirety. Generally, to form the rare earth nanodots, excess stoichiometric amount of rare earth elements are added to YBCO. The added rare earth elements also substitute into the yttrium sites of the YBCO structure and lead to a decrease in the stacking fault density. As shown in FIG. 7, this decrease in stacking fault density becomes more pronounced with increasing amounts of stoichiometric excess rare earth elements added to the YBCO films.

Thus, the introduction of two or more rare earth elements into an HTS film produces two conflicting outcomes. Additional rare earth elements in an HTS film serve to introduce flux pinning sites that improve Ic over all angles of magnetic field (except H//ab). At the same time, as demonstrated in FIG. 7, additional rare earth elements reduce the stacking fault density, which leads to a reduction in Ic measured at H//ab.

A high temperature superconductor having planar magnetic flux pinning centers can provide an increased density of planar defects such as stacking faults when two or more rare earth elements are utilized in the RE-123 layers. Thus, the HTS film exhibits both the advantages of a film having high stacking fault density, namely, high Ic at H//ab, and of a film having rare earth element-based flux pinning sites, namely, an overall increase in Ic over all angles of magnetic field.

In one or more embodiments, the planar defects may be spaced apart, on average, about 10, 12, 15, 20, 40, 60, 80, and 100 nm from each other, where the spacing is measured along the direction perpendicular to the plane of the planar defects. In certain embodiments, RE-123 superconductors have at least one different rare earth element substituted in at least one of the rare earth lattice sites of the RE-123 and have, on average, at least about one planar defect per 100 nm. For example, the planar defects may be stacking faults having an average spacing of about 10, 12, 15, 20, 40, 60, 80, and 100 nm. In other embodiments, the RE-123 superconductors includes at least one different rare earth element substituted in at least one of the rare earth lattice sites of the RE-123, at least one rare earth nanoparticle in RE-123 superconductors, and an average planar defect density of about 0.01 $nm^{-1}$, where the different rare earth content is above the stoichiometric amount for substitution into the rare earth lattices sites of the RE-123. For example, the planar defects may be stacking faults having an average spacing of about 10, 12, 15, 20, 40, 60, 80, and 100 nm.

Metal Organic Deposition

In certain embodiments, a metal organic (solution based) deposition (MOD) process can be used to obtain highly oriented oxide superconducting materials. An MOD process represents an attractive system because the precursor solution is versatile and can be varied over a wide range of compositions and concentrations. For example, in an MOD process to make RE-123 superconductors from precursors, (1) precursor solutions containing at least two rare earth elements can be decomposed to form a layer containing an intermediate of RE-123 (e.g. a metal oxyhalide intermediate);

(2) the intermediate layer can then be further decomposed to form a RE-123 layer somewhat deficient in oxygen content;

(3) then, an oxygenation step can be carried out at temperatures greater than 550° C., where the oxygenation step does not lead to substantial decomposition of RE-123 and leads to an average planar defect density of greater than 0.01 $nm^{-1}$.

The precursor components include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. At least one of the compounds is a fluorine-containing compound, such as the trifluoroacetate.

In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). The rare earth elements may be selected from the group of scandium, yttrium, cerium, neodymium, samarium, europium, gadolinium, terbium, dysprosium, holmium, erbium, thulium, ytterbium, and lutetium. Typically, the alkaline earth metal is barium, strontium or calcium.

Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO).

Generally, the transition metal can be copper. The transition metal salt should be soluble in the solvent(s) contained in the precursor solution. In one or more embodiments, the rare earth and the alkaline earth elements can form a metal or mixed metal oxyfluoride in place of or in addition to a rare earth oxide and an alkaline earth fluoride.

An oxyfluoride film is considered to be any film that is a precursor to a RE-123 oxide superconductor film that is comprised of (1) a mixture of $BaF_2$, a rare earth oxide or fluoride and/or transition metal, transition metal oxide or transition metal fluoride, (2) a mixture of a compound comprised of a RE—Ba—O—F phase, a rare earth oxide or fluoride and/or transition metal oxide or fluoride, or (3) a mixture of a compound comprised of a Ba—O—F phase, rare earth oxides or fluorides and/or transition metal oxide or fluoride.

RE-123 Precursors

Precursor compositions can be deposited on substrates, either directly onto the substrate, or onto a buffer- and/or intermediate-coated substrate, thereby forming biaxially textured superconducting oxide layers from the precursor compositions. The precursor compositions include components that are a salt of a rare earth element, a salt of an alkaline earth metal, and a salt of a transition metal in one or more solvents.

Various different precursors can be utilized to form the RE-123 type films. As used herein, RE-123 precursors will generally refer to any one of the various different precursors that can be utilized, three of which are described in detail below for illustrative purposes only.

1. RE-123 Precursors Having Two or More Rare Earth Elements

In one or more embodiments, pinning sites can be introduced into a RE-123 oxide superconductor by partial replacement of one or more of the elements of 123-oxide superconductor by a suitable dopant. Any of the rare earth elements, alkaline earth metals or transition metals can be doped.

In one or more embodiments, a precursor solution is provided that contains dopant components for the formation of a doped RE-123 having two or more rare earth elements. The dopant components include soluble compounds of rare earth elements, alkaline earth metals and/or transition metals that substitute for a metal of RE-123. Such compounds include, for example, salts (e.g., nitrates, acetates, alkoxides, iodides, sulfates, and trifluoroacetates), oxides and hydroxides of these metals. The degree of substitution can be controlled by appropriate adjustment of the composition of the precursor solution.

The solvent or combination of solvents used in the precursor solution can include any solvent or combination of solvents capable of dissolving the metal salts (e.g., metal trifluoroacetate(s)). Such solvents include, for example, alcohols, including methanol, ethanol, isopropanol and butanol.

In certain embodiments, the precursor composition can have a relatively small amount of free acid. In aqueous solutions, this can correspond to a precursor composition with a relatively neutral pH (e.g., neither strongly acidic nor strongly basic). The total free acid concentration of the precursor composition can be less than about $10^{-3}$ molar (or less than about $10^{-5}$ molar or about $10^{-7}$ molar). Examples of free acids that can be contained in a precursor composition include trifluoroacetic acid, carboxylate acids, acetic acid, nitric acid, sulfuric acid, acids of iodides, acids of bromides and acids of sulfates. When the precursor composition contains water, the precursor composition can have a pH of at least about 3 (or at least about 5 or about 7). In some embodiments, the precursor composition can have a relatively low water content (e.g., less than about 50 volume percent water, less than about 35 volume percent water, or less than about 25 volume percent water).

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

In one or more embodiments, doped-123 material may be $RE_1/RE_2$-123, where $RE_1$ and $RE_2$ represent one or more rare earth elements, such as scandium, yttrium, lanthanum, cerium, praseodymium, neodymium, samarium, europium, gadolinium, terbium, dysprosium, holmium, erbium, thulium, ytterbium, and/or lutetium. The doped-123 material may be $RE_1/RE_2$-123, where $RE_1$ and $RE_2$ represent two different rare earth elements, and larger numbers of different RE's can be used. Any combination of two or more rare earth elements may be used. Substitutions of up to 50 atomic percent are useful. In one or more embodiments, substitutions for about 20 atomic weight percent may be used. More than two rare earths in the RE-123 may be used, for example the composition Nd—Eu—Gd can used for improved flux pinning.

According to one or more embodiments, atomistic defects or elemental substitutions in the RE-123 grains can be achieved by mixing different rare earths in the Y123 atomic structure. Most elements of the rare earth series (from lanthanum to lutetium) are known to enter into this atomic structure without substantially changing the superconducting transition temperature; yet their different atomic sizes can create local pinning points from the strain fields or varying orbital energies. Some of the rare earths also have local magnetic moments, which can create another kind of local perturbation contributing to the pinning.

In certain embodiments, doped-123 material may be $RE_1/RE_2$-123, where $RE_1$ is yttrium and $RE_2$ can be one or more rare earth elements, such as scandium, yttrium, lanthanum, cerium, praseodymium, neodymium, samarium, europium, gadolinium, terbium, dysprosium, and/or holmium.

In alternate embodiments, a precursor solution is formed of an organic solution containing metal trifluoroacetates prepared from powders of $BaCO_3$, $Y_2(CO_3)_3 \cdot 3H_2O$ and $Cu(OH)_2CO_3$ and any additive and/or dopant components combined and reacted using methods known to those skilled in the art. For example, the Ba:Y:Cu powders can be combined in a 2:1:3 ratio with between 20-30% (5.5-6.0 M) excess trifluoroacetic acid in methyl alcohol and then refluxed (e.g., for approximately four to ten hours) to produce a solution substantially 0.94 M based on copper content.

2. RE-123 Precursors Having Two or More Rare Earth Elements and Excess Transition Metal Elements In addition to the use of two or more rare earth elements in the precursor solution (and the resultant HTS layer), the transition metal concentrations in the precursor solutions can be adjusted to achieve an overall transition metal to alkaline earth metal ratio of greater than 1.5. The overall transition metal to alkaline earth metal ratio can be at least 1.6, or at least 1.8, or at least 2.0 or can be in the range of 1.65-1.95. The precursor solution can be deposited in one or more layers of the same or different composition to achieve an overall transition metal to alkaline earth metal ratio of greater than 1.5 and an overall thickness of greater than 0.8 μm or about 1.0 μm. By "overall" as that term is used herein it is meant the total one or more layers that are deposited in the formation a of superconductor film.

A RE-123 film can be prepared by adjusting the Cu and Ba content in the precursor solution to achieve an overall Cu to Ba ratio of greater than 1.5. The precursor film is then decomposed to achieve a metal oxyfluoride film having near stoichiometric Ba:Cu=2:3 at the buffer/RE-123 interface region and an overall Cu to Ba ratio greater than 1.5.

A RE-123 film can be prepared by increasing the Cu content in a precursor solution, and decomposing the precursor film to achieve a near stoichiometric Ba:Cu=2:3 at the buffer/RE-123 interface and an overall Cu to Ba ratio greater than 1.5. The Cu content in the precursor solution can be increased by at least about 5 mol %, or by at least about 10 mol %, or at least about 20 mol %, or about 5-30 mol % relative to the metal content needed to prepare a precursor solution containing stoichiometric proportions of the constituent alkaline earth and transition metals.

A RE-123 film can be prepared by decreasing the Ba content in a precursor solution, and decomposing the precursor film to achieve a near stoichiometric Ba:Cu=2:3 at the buffer/RE-123 interface region and an overall Cu to Ba ratio greater than 1.5. The Ba content in the precursor solution can be decreased by at least about 5 mol %, or by at least about 10 mol %, or at least about 20 mol %, or about 5-30 mol % relative to the metal content needed to prepare a precursor solution containing stoichiometric proportions of the constituent metals.

A RE-123 film can be prepared by increasing the Cu content while decreasing the Ba content in a precursor solution, and decomposing the precursor film to achieve a near stoichiometric Ba:Cu=2:3 at the buffer/RE-123 interface region and an overall Cu to Ba ratio greater than 1.5. The Cu content in the precursor solution can be increased by at least about 5 mol %, or by at least about 10 mol %, or at least about 20 mol %, or about 5-30 mol % while the Ba content in the precursor solution can be decreased by at least about 5 mol %, or by at least about 10 mol %, or at least about 20 mol %, or about 10-30 mol % relative to the metal content needed to prepare a precursor solution containing stoichiometric proportions of the constituent metals.

While not wishing to be bound by theory, excess Cu may allow more favorable conditions in forming Y124-type intergrowth as Y124 is essentially RE-123 with an extra CuO plane inserted in the unit cell. Moreover, in an MOD process to make RE-123 films from trifluoroacetate (TFA) precursors, RE-123 nucleation at the buffer layer/metal oxyfluoride layer interface can be one factor in texture development. For example, the variation between the Cu and Ba concentrations at the top and bottom of the film can become more pronounced as the film thickness increases. Copper deficiency at the buffer/RE-123 interface, e.g., a low ratio of copper to barium, can result in poor nucleation of RE-123 or reduced growth kinetics, thereby leading to degraded performance of the RE-123 films. Hence, maintaining a Cu to Ba ratio of greater than 1.5 through out the film thickness can improve the growth of the RE-123 throughout the film thickness.

Further information on suitable additive and dopants for use in precursor solutions is found in co-pending and commonly owned U.S. patent application Ser. No. 11/241,636, filed Sep. 30, 2005, and entitled "Thick Superconductor Films with Improved Performance," which claims priority to U.S. Patent Application No. 60/615,289, filed on Oct. 1, 2004, U.S. Patent Application No. 60/703,836, filed on Jul. 29, 2005, and U.S. Patent Application No. 60/703,815, filed on Jul. 29, 2005, all of which are hereby incorporated by reference herein in their entirety. Additional information can be found in U.S. patent application Ser. No. 11/193,262, filed on Jul. 29, 2005, which claims priority to U.S. Patent Application No. 60/615,289, filed on Oct. 1, 2004, both of which are hereby incorporated by reference herein in their entirety.

3. RE-123 Precursors Having Nanodots

In addition to the use of two or more rare earth elements in the precursor solution and/or excess transition metal elements (and the resultant HTS layer), the composition of the precursor solution may be further adjusted to so that the two or more rare earth elements are in a stoichiometric excess to cause formation for nanosized particles in the resultant HTS layer. In certain embodiments, the additive component can include soluble compounds of rare earth elements, such as scandium, yttrium, lanthanum, cerium, praseodymium, neodymium, samarium, europium, gadolinium, terbium, dysprosium, holmium, erbium, thulium, ytterbium, and/or lutetium, in the precursor solution for forming Y123 layers. For example, soluble yttrium salts may be included in the precursor solution having two or more rare earth elements in excess of that required to form Y123. The excess yttrium can be processed according to one or more embodiments to form yttrium-rich secondary phase nanoparticles, such as $Y_2BaCuO_5$ (Y211), $Y_2Cu_2O_5$ and/or $Y_2O_3$, which can serve as particulate pinning sites in the superconducting oxide film.

The stoichiometric excess amount of rare earth elements can also be added via any suitable methods such as utilizing soluble rare earth metal compounds. Such compounds include, for example, salts (e.g., nitrates, acetates, alkoxides, halides, sulfates, and trifluoroacetates), oxides and hydroxides of these metals. The additive component may also be to the precursor solution as a powder to form a nanoparticle dispersion.

Furthermore, in addition to the nanodots formed by stoichiometric excess amounts of rare earth elements in RE-123 superconductors, any additional additive compound can be utilized to form nanodots. For example, suitable additive compound can include any metal compound that is soluble in the solvent(s) contained in the precursor solution and that forms metal oxide or metal in the oxide superconductor film. Exemplary additive components include alkaline metal and/or transition metal compounds in excess of or in addition to those of the precursor component. Soluble compounds of metal compounds used in the formation of nanoparticles refer to compounds of these metals, e.g., alkaline earth metals, such as calcium, barium and strontium, transition metals, such as scandium, titanium, vanadium, chromium, manganese, iron, cobalt, nickel and zirconium, cerium, silver, aluminum, and magnesium that are capable of dissolving in the solvents contained in the precursor solution. Such compounds include, for example, salts (e.g., nitrates, acetates, alkoxides, halides, sulfates, and trifluoroacetates), oxides and hydroxides of these metals. The additive component may also be to the precursor solution as a powder to form a nanoparticle dispersion.

In certain embodiments, the additive component can include soluble compounds of alkaline earths and/or transition metals, cerium, zirconium, silver, aluminum, or magnesium that can form second phase nanoparticles that acts as pinning sites in an oxide superconductor film. In one or more embodiments, additive components may include stoichiometric excesses of soluble compounds included in the precursor solution as precursor components.

Further information on suitable additive and dopants for use in precursor solutions is found in co-pending and commonly owned U.S. patent application Ser. No. 10/758,710, filed Jan. 1, 2004, and entitled "Oxide Films with Nanodot Flux Pinning Centers," which is hereby incorporated by reference herein in its entirety.

In these exemplary RE-123 precursors described above, it should be noted that it was conventionally thought that the addition of substituted rare earths lead to a decreased concentration of planar defects, such as stacking faults, that can lead to a decrease in critical current densities. Hence, addition of rare earths that substitute into the yttrium sites of Y123 have generally been avoided. Applicants have now unexpectedly found a new processing window wherein the loss of stacking faults can be mitigated leading to improved properties, as will be described more fully below.

Formation of an Underlying Layer

Figure 8:
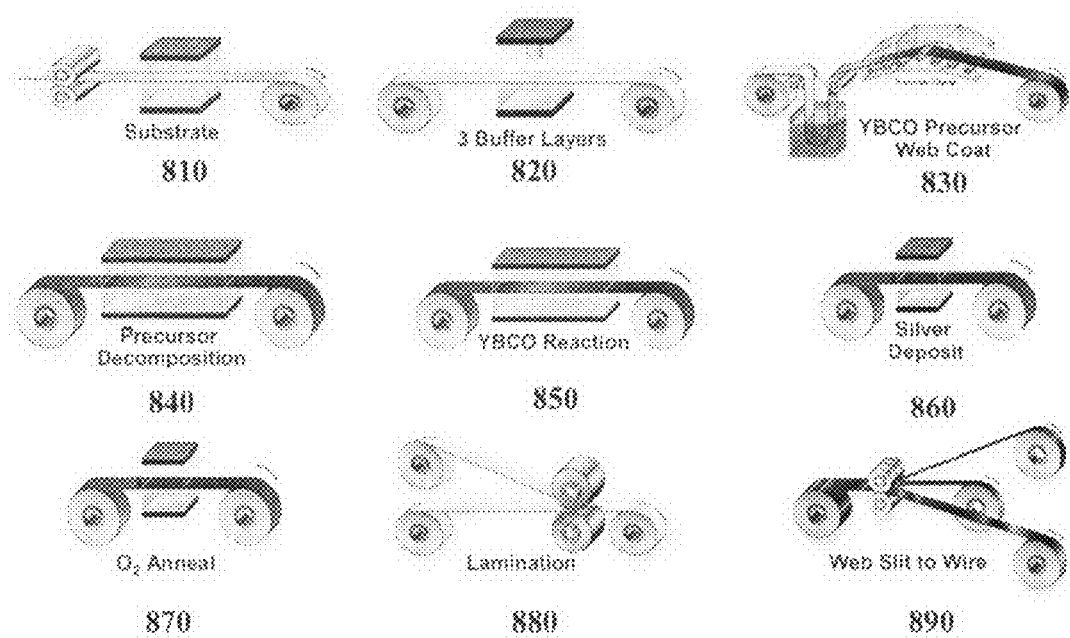
FIG. 8 is a schematic illustration of a system and process used to prepare a textured, patterned oxide superconductor wire according to certain embodiments of the present invention.

The HTS layer is typically deposited on a textured underlying layer. As an example, a web coating method of depositing the precursor film on a textured template having the architecture $CeO_2/YSZ/Y_2O_3/NiW$ is shown in FIG. 8. The textured template can provided in widths of about 1 to 10 cm.

As shown in FIG. 8, at a first station 810, a wire substrate can be treated to obtain a biaxial texture. Preferably, the substrate surface has a relatively well-defined crystallographic orientation. For example, the surface can be a biaxially textured surface (e.g., a (113)[211] surface) or a cube-textured surface (e.g., a (100)[011] surface or a (100)[001] surface). Preferably, the peaks in an X-ray diffraction pole figure of surface 12 have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate can be a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain embodiments, the substrate can contain more than two metals (e.g., a ternary alloy or a quarternary alloy). In some embodiments, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one Torr, less than about 1×10-3 Torr, less than about 1×10-6 Torr) or relatively high (e.g., greater than about 1 Torr, greater than about 100 Torr, greater than about 760 Torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 820, a buffer layer is formed on the textured substrate. The buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface.

Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Deposition of RE-123 Precursors

Once the textured substrate including buffer layers is prepared, a precursor solution can be deposited at a station 830 as described above. The methods of disposing the superconducting composition on the underlying layer (e.g., on a surface of a substrate, such as a substrate having an alloy layer with one or more buffer layers disposed thereon) can include spin coating, dip coating, slot coating, web coating and other techniques known in the art. For example, when spin coating is used, the composition can be disposed on the underlying layer and the spin rate can be ramped from about zero revolutions per minute (RPM) to about 2,000 RPM in about 0.5 second. This spin rate can be held for about five seconds, and the spin rate can then be ramped to about 4,000 RPM in about 0.5 second. This spin rate can be held for about 60 seconds, and the spin rate can then be decreased to about zero RPM. As known to those skilled in the art, other spin coating conditions can also be used. Film thickness can vary, but is typically in the range of 0.2-3.0 µm, and more typically about 1-2 µm.

In certain embodiments, the precursor layer can be deposited in a single step. For example, a precursor solution described above can be deposited at a thickness of at least 0.8 µm using the spin coating technique described above.

In alternate embodiments, the precursor layer can be deposited in two or more steps and using the same or different precursor solutions. For example, RE-123 films can be prepared by depositing a layer of RE-123 precursor solution with excess transition metal content, a layer of transition metal precursor solution, and a layer of RE-123 precursor solution containing constituent metals of RE-123 in approximately a stoichiometric amount. The overall composition of the three layers can provide a transition metal:alkaline earth metal ratio that is greater than 1.5.

In other embodiments, the first precursor layer may be deposited on the substrate and decomposed (as will be described below) before the second precursor layer is deposited and decomposed. In another embodiment, the precursor layers can be deposited in two or more steps and decomposed in a single step.

Decomposition of RE-123 Precursors to Intermediate Layers

At a subsequent station 840, the precursor components can be decomposed. The conversion of the precursor components into an oxide superconductor can be carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

Typically, the initial temperature in this step can be about room temperature, and the final temperature can be from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute.

During this step, the partial pressure of water vapor in the nominal gas environment can be maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating can then be continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating can further be continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride can be formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

Conversion of Intermediate Layer to Non-Superconducting Perovskite Structure

The intermediate film can then be heated to transform the layer to a perovskite structure at a further processing station 850. For example, a perovskite having a tetragonal crystal symmetry can develop. Typically, this step can be performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film can then be held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

Without wishing to be bound by theory, a generally reaction mechanism that is believed to be taking place is illustrated by way of an example of the formation of Y123 layers. It is believed that at elevated temperatures barium fluoride can reversibly react with a reactant gas (e.g., a reactant gas containing water) to form a BaO superconductor intermediate according to the equation:

$$BaF_2 + H_2O \leftrightarrow BaO + 2HF$$

It is further believed that at these elevated temperatures the BaO superconductor intermediate can react with $Y_2O_3$ and CuO to form YBCO according to the equation:

$$2BaO + \tfrac{1}{2}Y_2O_3 + 3CuO \leftrightarrow YBa_2Cu_3O_{7-y}$$

As described above, it is generally thought that the process conditions described above generally lead to a oxygen-deficient lattice leading to a tetragonal lattice and an oxygenation step is carried out to transform the tetragonal lattice into an orthorhombic lattice.

It is contemplated that other methods of forming the HTS layer, such as MOCVD, PLD, and sputtering, may be employed, which will be readily apparent to one of ordinary skill in the art.

Oxygenation Step to Obtain Superconducting Perovskite Layer Having High Stacking Fault Density In certain embodiments, an oxygen permeable capping layer can be deposited on the YBCO at station 860. For example, a silver layer can be deposited on the YBCO that can aid the diffusion of oxygen into YBCO in a subsequent processing step.

In certain embodiments, the HTS layer can be heated at station 870 to a temperature of at least 550° C. in an oxidizing environment. For example, the HTS layer can be heated at a temperature from about 550° C. to about 1000° C. for at least a few seconds, minutes, or even hours in an environment containing oxygen. For example, the environment can be air, which contains about 21% oxygen. Alternatively, the environment can contain any suitable oxygen content, such as 30%, 40%, 50%, 60%, 70%, 80%, 90%, or 100% oxygen. Moreover, the HTS layer can be heated at any suitable pressure. For example, the pressure can range from 0.5 to 2 atm, or 0.5 to 1.5 atm, or around 1 atm.

The HTS layer can then be cooled to room temperature with any suitable oxygen content and pressure. For example, the cooling environment can be air, which contains about 21% oxygen. Alternatively, the environment can contain any suitable oxygen content, such as 30%, 40%, 50%, 60%, 70%, 80%, 90%, or 100% oxygen. Moreover, the HTS layer can be cooled to room temperature at any suitable pressure. For example, the pressure can range from 0.5 to 2 atm, or 0.5 to 1.5 atm, or around 1 atm.

The resultant superconductor layer can be a well-ordered (e.g., biaxially textured in plane, or c-axis out of plane and biaxially textured in plane). In certain embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

As described above, oxygenation was not previously carried out at temperatures above 550° C. due to the decomposition of YBCO. Moreover, as described earlier in conjunction with FIG. 7, addition of rare earth elements into YBCO has led to a significant decrease in the stacking fault density.

However, in certain embodiments, it has been surprisingly discovered that oxygenation at temperatures above the decomposition temperature of YBCO mitigates the loss of stacking fault density despite the presence of rare earth elements and without significantly decomposing the RE-123 films.

The presence of these stacking faults further provide superior ratio between Ic:H//ab and Ic:H//c that is at least 1.2. For example, ratios greater than 1.2, 1.5, 2, 2.5, 3.0, 3.5, and 4.0 can be achieved. Moreover, an absolute value increase Ic in all intermediate angles between and including Ic:H//ab and Ic:H//c can be obtained.

Additional Processing Steps

Further processing steps can be performed. For example, noble metal deposition at station 860, lamination at station 880, and slitting at station 890 can be performed in any suitable order to complete the process.

Certain examples are described below, which are intended as illustrative only, since numerous modifications and variations will be apparent to those skilled in the art.

EXAMPLES

Example 1

Preparation of $Y(Dy_{0.5})Ba_2Cu_{3.225}O_{7-y}$ Films

A YBCO precursor solution having a stoichiometry of Y:Dy:Ba:Cu of 1:0.5:2:3.225 and [Y]=0.3M was prepared by dissolving about 0.64 grams of $Y(CF_3CO_2)_3$, about 0.26 grams of $Dy(CH_3CO_2)_3$, about 1.17 grams of $Ba(CF_3CO_2)_2$ and about 1.01 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The precursor solution was deposited by a slot die coating technique, on a length (20 cm to 100 meter) of 4 cm wide biaxially textured oxide buffered metallic substrate with the structure Ni(5 at %)W/$Y_2O_3$/YSZ/$CeO_2$. A quantity of precursor solution was deposited per unit area to produce about a 0.8 μm thick $YBa_2Cu_3O_{7-x}$ film on the substrate.

The coated sample was decomposed to an intermediate metal oxyfluoride film by heating, in a 2.25" diameter tube furnace, from room temperature to about 200° C. at a rate of about 15° C. per minute, then from about 200° C. to about 250 C. at a rate of about 0.9° C. per minute and then from about 250° C. to about 400° C. at a rate of about 5° C. per minute in a flowing gas environment having a total gas pressure of about 760 Torr (water vapor pressure of about 24 Torr and balance oxygen).

The metal oxyfluoride film was then heat treated to form an oxide superconductor. The decomposed intermediate film was heated in a furnace to about 785° C. at a rate of about 250° C. per minute in an environment having a total gas pressure of about 1 Torr (water vapor pressure of about 600 mTorr, and oxygen gas pressure of about 180 mTorr, balance of $N_2$) and heat treated for about 7.5 min in an environment having a total gas pressure of about 1 Torr (water vapor pressure of about 820 mTorr, and oxygen gas pressure of about 180 mTorr). The film was then cooled to room temperature in about 200 mTorr $O_2$, 800 mTorr $N_2$. The resulting film and was about 0.8 micron thick.

The reacted film was then coated with 3 μm thick Ag. The coated film was heat treated in pure $O_2$ by heating the film to 400° C. (standard method), 550° C. (standard method), 600° C. (improved method), 650° C. (improved method), 700° C. (improved method), or 750° C. (improved method) with a heating rate of 10° C./min, held at the holding temperature for 30 min, then cooled to room temperature by the cooling rate about 1.2° C./min.

Figure 9:
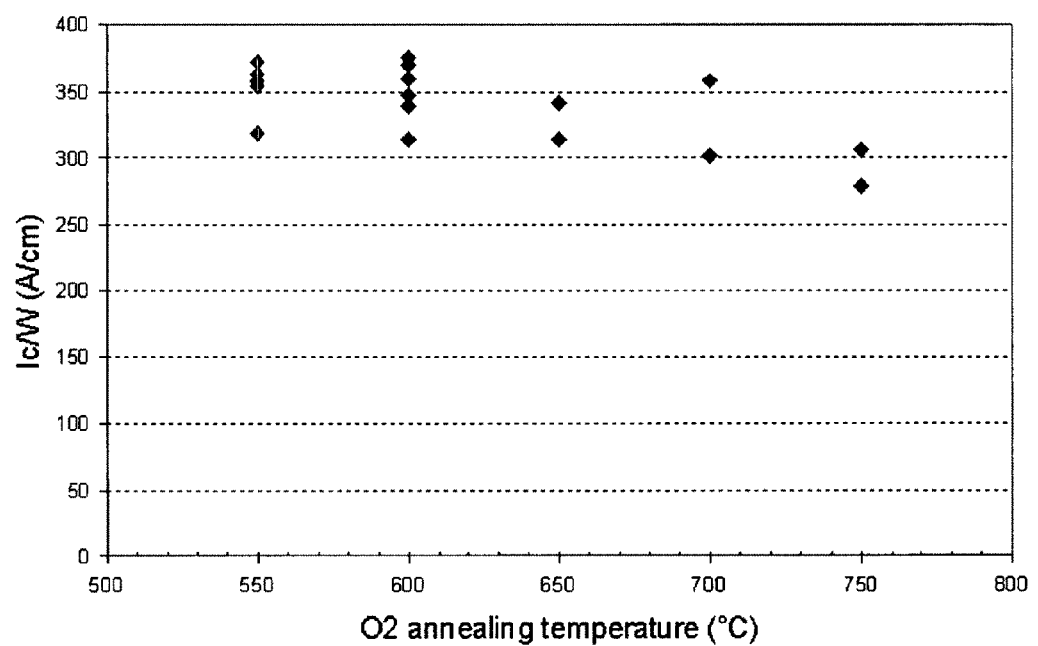
FIG. 9 shows the self-field critical current density (Ic:sf) of a RE-123 layer oxygenated at various temperatures from 550° C. to 750° C. showing little to no change in Ic:sf with increasing oxygenation temperatures in accordance with certain embodiments of the present invention.
Figure 10:
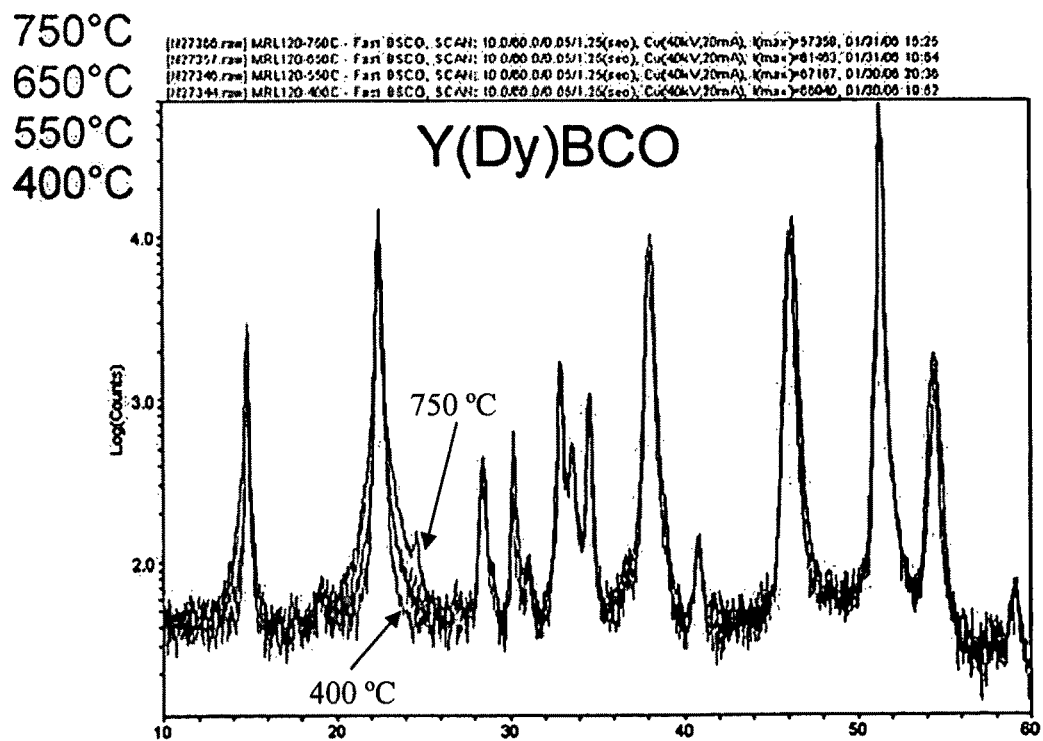
FIG. 10 shows an x-ray diffraction of a RE-123 layer oxygenated at various temperatures from 400° C. to 750° C. leading to increased stacking fault density at higher oxygenation temperatures in accordance with certain embodiments of the present invention.

The Ic of the $O_2$ annealed films were measured by four probe method at 77K, without any applied magnetic field (self-field, sf). In other words, the critical current density of the films were measured without any directional dependence relative to an applied field. Results are presented in FIG. 9 as a plot of Ic/width (Ic/W) v. oxygenation temperature (O2 annealing temperature). As shown in FIG. 9, samples made at 600° C., 650° C., 700° C., and 750° C. show little to no (within experimental noise values) decrease in the critical currents as compared to those made at 550° C. Without wishing to be bound by theory, it may be possible that this enhanced performance (contrast FIG. 9 with FIG. 15) may be due to the increased number of stacking fault density that occurs, without any bulk decomposition of the superconducting phase. As shown in FIG. 10, the films oxygenated at 650° C. and at 750° C. show broadening of the peaks, relative to those carried out at 400° C. and at 550° C., signifying an increase in the stacking fault density.

Figure 11:
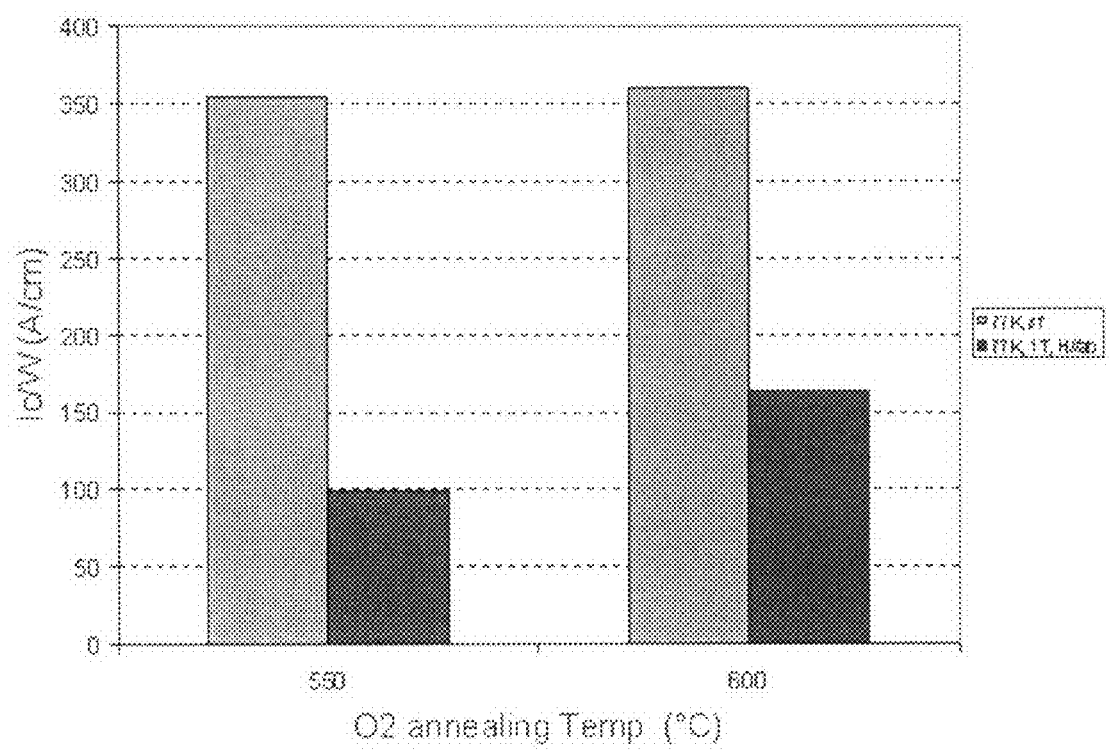
FIG. 11 shows critical current density when magnetic field is parallel to the ab-plane (Ic:H//ab) of a RE-123 layer oxygenated 550° C. and 600° C. showing an increase in Ic:H//ab with increasing oxygenation temperatures in accordance with certain embodiments of the present invention.

The Ic:H//ab of the film was also measured by four probe method at 77K applying a magnetic field of 1 T. As shown in FIG. 11, there appears to be an absolute increase in Ic:H//ab relative to Ic:sf as oxygenation temperature is increased from 550° C. to 600° C.

Example 2

Preparation of $YBa_2CU_{3.225}O_{7-y}/Y(Dy_{0.5})Ba_2Cu_{3.225}O_{7-y}$ Double Coated Films A YBCO precursor solution having a stoichiometry of Y:Ba:Cu of 1:2:3.225 and [Y]=0.4M was prepared by dissolving about 0.86 grams of $Y(CF_3CO_2)_3$, about 1.50 grams of $Ba(CF_3CO_2)_2$ and about 1.35 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The solution preparation for $Y(Dy_{0.5})Ba_2Cu_{3.225}O_{7-y}$ was described in Example 1. First, the precursor solution for $Y(Dy_{0.5})Ba_2Cu_{3.225}O_{7-y}$ was deposited and decomposed by the method described in Example 1.

Second, the decomposed metal oxyfluoride film was coated again by using solution of $YBa_2Cu_{3.225}O_{7-y}$ as describe in Example 1, except this time the $2^{nd}$ layer coating thickness is targeted at about 0.6 μm final thickness. After the 2nd layer coating, the film was decomposed as described in Example 1, except that $p_{total}$=760 Torr, $p_{H2O}$=9.5 Torr, and the balance being $O_2$.

The metal oxyfluoride film was then heat treated to form an oxide superconductor. The decomposed intermediate film was heated in a furnace to about 785° C. at a rate of about 250° C. per minute in an environment having a total gas pressure of about 1 Torr (water vapor pressure of about 820 mTorr, and oxygen gas pressure of about 180 mTorr) and heat treated for about 10 min in an environment having a total gas pressure of about 1 Torr (water vapor pressure of about 820 mTorr, and oxygen gas pressure of about 180 mTorr). The film was then cooled to room temperature in about 200 mTorr $O_2$, 800 mTorr $N_2$. The resulting film was about 1.4 micron thick.

The reacted film was then coated with 3 μm thick Ag by evaporation. The coated film was heat treated in pure $O_2$ by heating the film to various temperatures between 550° C. and 750° C. (see FIG. 12) by a heating rate about 10° C./min, held for 30 min and then cooled down to room temperature at a rate about 1.2° C./min.

Figure 12:
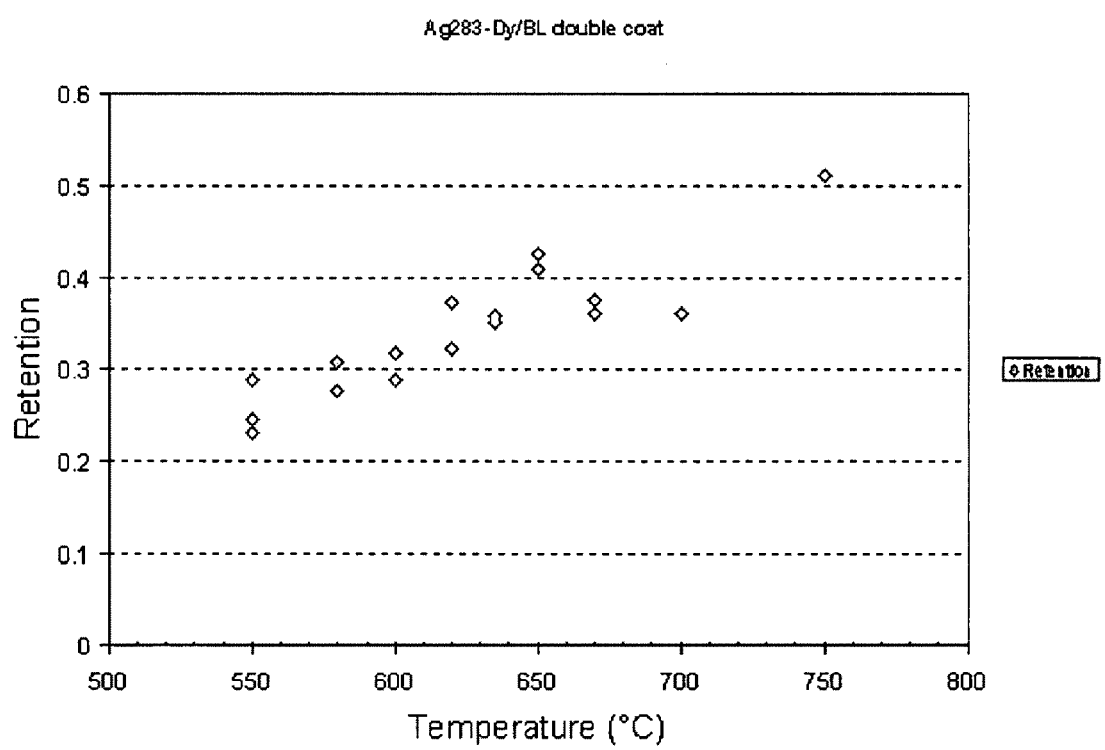
FIG. 12 shows the ratio of critical current density when magnetic field is parallel to the ab-plane (Ic:H//ab) to the self-field critical current density (Ic:sf) ("Retention") of a RE-123 layer oxygenated at various temperatures from 550° C. to 750° C. showing an increase in the ratio of Ic:H//ab to Ic:sf ("Retention") with increasing oxygenation temperatures in accordance with certain embodiments of the present invention.

The Ic of the $O_2$ annealed films were measured by four probe method at 77K, without any applied magnetic field (self-field, sf). The Ic:H//ab of the film was also measured by four probe method at 77K applying a magnetic field of 1 T. The retention value correspond to Ic:H//ab divided by Ic:sf. As shown in FIG. 12, there is a general increase in the retention value with increasing temperatures suggesting an absolute increase in the Ic:H//ab value relative to other Ic values with increasing oxygen anneal temperatures.

Figure 13:
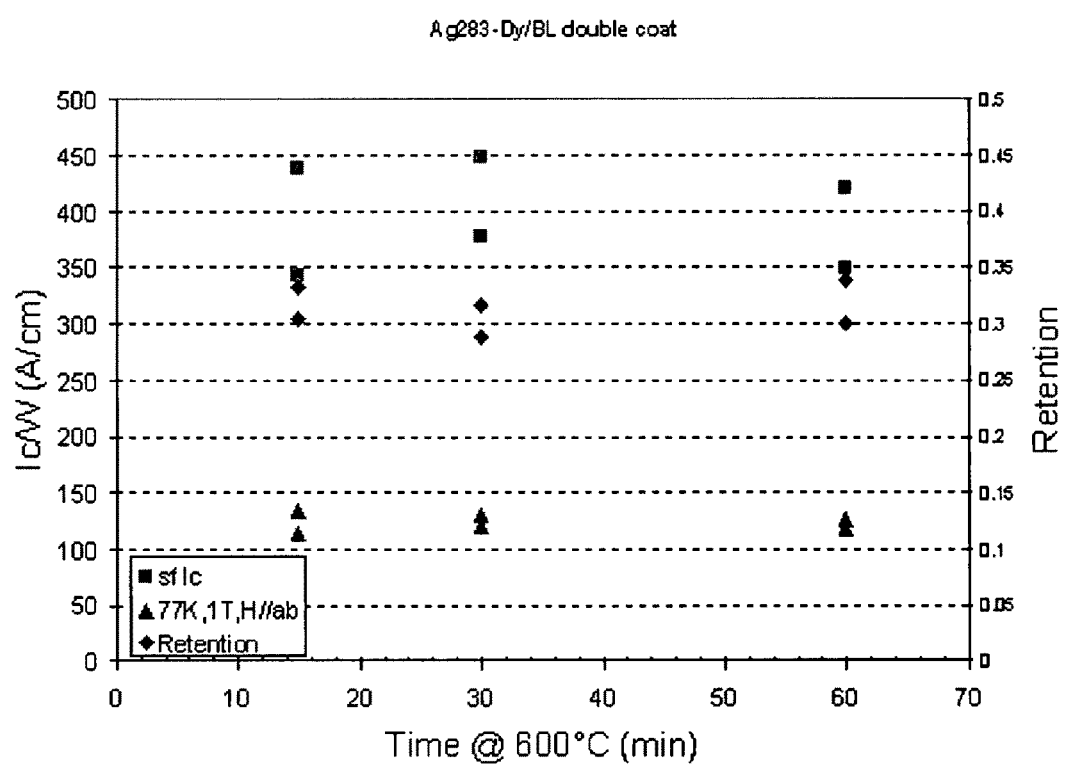
FIG. 13 shows the ratio of critical current density when magnetic field is parallel to the ab-plane (Ic:H//ab) to the self-field critical current density (Ic:sf) ("Retention") of a RE-123 layer oxygenated at 600° C. as a function of different anneal time showing little to no change in the ratio of Ic:H//ab to Ic:sf ("Retention") in accordance with certain embodiments of the present invention.

Moreover, as shown in FIG. 13, the measured Ic:sf and Ic:H//ab values appear to remain stable with prolonged anneal times, suggesting decomposition of the phase is not occurring.

Comparative Example 1

Preparation of $YBa_2Cu_{3.225}O_{7-y}$ Films

The solution preparation for $YBa_2Cu_{3.225}O_{7-y}$ was described in Example 2. Then, the precursor solution for $YBa_2Cu_{3.225}O_{7-y}$ was deposited and decomposed by the method described in Example 1.

The reacted film was then coated with 3 μm thick Ag by evaporation. The coated film was heat treated in pure $O_2$ by heating the film to various temperatures between 550° C. and 750° C. (see FIG. 14) by a heating rate about 10° C./min, held for 30 min and then cooled down to room temperature at a rate about 1.2° C./min.

Figure 14:
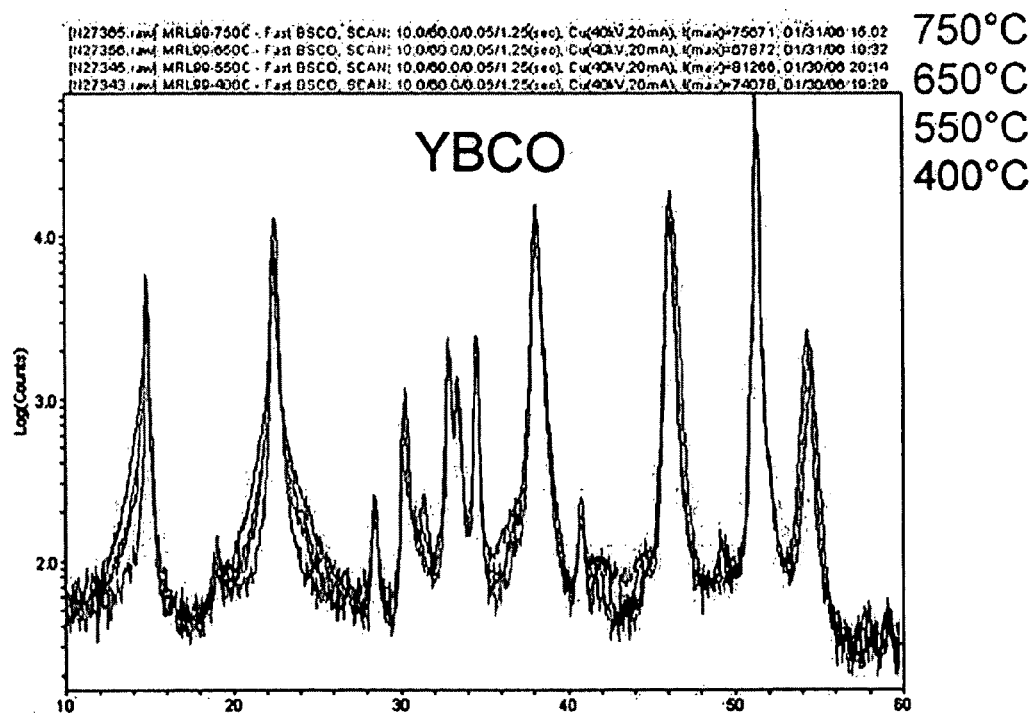
FIG. 14 shows an x-ray diffraction of a Y-123 layer oxygenated at various temperatures from 400° C. to 750° C. leading to increased stacking fault density at higher oxygenation temperatures.

FIG. 14 was renormalized so that the intensity of the peaks remain constant for the different oxygenation temperatures because the peak intensities decreased with increasing oxygenation temperatures. The broadening of the peaks and the decrease in the peak intensity strongly suggest decomposition of the Y-123 phase is occurring.

This is further supported by the measurements of Ic:sf for samples oxygenated at different temperatures. As shown in FIG. 15, samples oxygenated at 600° C. and 650° C. show lower Ic:sf than those oxygenated at 550° C. contrary to that shown in FIG. 9.

INCORPORATION BY REFERENCE

The following documents are hereby incorporated by reference in their entirety: U.S. Pat. No. 5,231,074, issued on Jul. 27, 1993, and entitled "Preparation of Highly Textured Oxide Superconducting Films from MOD Precursor Solutions;" U.S. Pat. No. 6,022,832, issued Feb. 8, 2000, and entitled "Low Vacuum Process for Producing Superconductor Articles with Epitaxial Layers;" U.S. Pat. No. 6,027,564, issued Feb. 22, 2000, and entitled "Low Vacuum Process for Producing Epitaxial Layers;" U.S. Pat. No. 6,190,752, issued Feb. 20, 2001, and entitled "Thin Films Having Rock-Salt-Like Structure Deposited on Amorphous Surfaces;" U.S. Pat. No. 6,537,689, issued Mar. 25, 2003, and entitled "Multi-Layer Superconductor Having Buffer Layer With Oriented Termination Plane;" PCT Publication No. WO 00/58530, published on Oct. 5, 2000, and entitled "Alloy Materials;" PCT Publication No. WO/58044, published on Oct. 5, 2000, and entitled "Alloy Materials;" PCT Publication No. WO 99/17307, published on Apr. 8, 1999, and entitled "Substrates with Improved Oxidation Resistance;" PCT Publication No. WO 99/16941, published on Apr. 8, 1999, and entitled "Substrates for Superconductors;" PCT Publication No. WO 98/58415, published on Dec. 23, 1998, and entitled "Controlled Conversion of Metal Oxyfluorides into Superconducting Oxides;" PCT Publication No. WO 01/11428, published on Feb. 15, 2001, and entitled "Multi-Layer Articles and Methods of Making Same;" PCT Publication No. WO 01/08232, published on Feb. 1, 2001, and entitled "Multi-Layer Articles And Methods Of Making Same;" PCT Publication No. WO 01/08235, published on Feb. 1, 2001, and entitled "Methods And Compositions For Making A Multi-Layer Article;" PCT Publication No. WO 01/08236, published on Feb. 1, 2001, and entitled "Coated Conductor Thick Film Precursor;" PCT Publication No. WO 01/08169, published on Feb. 1, 2001, and entitled "Coated Conductors With Reduced A.C. Loss;" PCT Publication No. WO 01/15245, published on Mar. 1, 2001, and entitled "Surface Control Alloy Substrates And Methods Of Manufacture Therefore;" PCT Publication No. WO 01/08170, published on Feb. 1, 2001, and entitled "Enhanced Purity Oxide Layer Formation;" PCT Publication No. WO 01/26164, published on Apr. 12, 2001, and entitled "Control of Oxide Layer Reaction Rates;" PCT Publication No. WO 01/26165, published on Apr. 12, 2001, and entitled "Oxide Layer Method;" PCT Publication No. WO 01/08233, published on Feb. 1, 2001, and entitled "Enhanced High Temperature Coated Superconductors;" PCT Publication No. WO 01/08231, published on Feb. 1, 2001, and entitled "Methods of Making A Superconductor;" PCT Publication No. WO 02/35615, published on Apr. 20, 2002, and entitled "Precursor Solutions and Methods of Making Same;" PCT Publication No. WO 2005/121414, published on Dec. 22, 2005, and entitled "Deposition of Buffer Layers on Textured Metal Surfaces;" PCT Publication No. WO 2005/081710, published on Sep. 9, 2005, and entitled "Oxide Films with Nanodot Flux Pinning Centers;" U.S. Pat. No. 6,436,317, issued on Aug. 20, 2002, and entitled, "Oxide Bronze Compositions And Textured Articles Manufactured In Accordance Therewith;" U.S. Provisional Patent Application Ser. No. 60/309,116, filed on Jul. 31, 2001, and entitled "Multi-Layer Superconductors And Methods Of Making Same;" U.S. Pat. No. 6,797,313, issued on Sep. 28, 2004, and entitled "Superconductor Methods and Reactor;" U.S. Provisional Patent Application Ser. No. 60/308,957, filed on Jul. 31, 2001, and entitled "Superconductor Methods and Reactors;" U.S. Provisional Patent Application Ser. No. 60/166,297, filed on Nov. 18, 1999, and entitled "Superconductor Articles and Compositions and Methods for Making Same;" U.S. Pat. No. 6,974,501, issued on Dec. 13, 2005, and entitled "Superconductor Articles and Compositions and Methods for Making Same;" U.S. patent application Ser. No. 10/955,866, filed on Sep. 29, 2004, and entitled "propwise Deposition of a Patterned Oxide Superconductor;" U.S.

patent application Ser. No. 11/241,636, filed on Sep. 30, 2005, and entitled "Thick Superconductor Films with Improved Performance;" U.S. patent application Ser. No. 10/955,875, filed on Sep. 29, 2004, and entitled "Low AC Loss Filamentary Coated Superconductors;" U.S. patent application Ser. No. 10/955,801, filed on Sep. 29, 2004, and entitled "Stacked Filamentary Coated Superconductors;" U.S. Provisional patent application Ser. No. 60/667,001, filed on Mar. 31, 2005, and entitled "Mesh-Type Stabilizer for Filamentary Coated Superconductors;" U.S. patent application Ser. No. 11/193,262, filed on Jul. 29, 2005, and entitled "Architecture for High Temperature Superconducting Wire;" U.S. Provisional patent application Ser. No. 60/703,815, filed Jul. 29, 2005, and entitled "High Temperature Superconducting Wires and Coils;" U.S. Provisional patent application Ser. No. 60/703,836, filed Jul. 29, 2005, and entitled "Thick Superconductor Films With Improved Performance;" PCT Publication No. WO 06/021003, published on Aug. 19, 2005, and entitled "Stacked Filamentary Coated Superconductors;" PCT Publication No. WO 06/023826, published on Aug. 19, 2005, and entitled "Low AC Loss Filamentary Coated Superconductors;" U.S. Provisional patent application Ser. No. 60/757,855, filed Jan. 10, 2006, and entitled "Method of Patterning Oxide Superconducting Films;" U.S. patent application Ser. No. 11/393,626, filed Mar. 30, 2006, and entitled "MeshOType Stabilizer for Filamentary Coated Superconductors;" U.S. patent application Ser. No. 11/490,779, filed Jul. 21, 2006, and entitled "Fabrication of Sealed High Temperature Superconductor Wires;" U.S. Provisional patent application Ser. No. 60/832,716, filed Jul. 21, 2006, and entitled "High Current, Compact Flexible Conductors Containing High Temperature Superconducting Tapes;" U.S. Provisional patent application Ser. No. 60/832,724, filed Jul. 21, 2006, and entitled "Low Resistance Splice for High Temperature Superconductor Wires;" U.S. Provisional patent application Ser. No. 60/832,871, filed Jul. 25, 2006, and entitled "High Temperature Superconductors Having Planar Magnetic Flux Pinning Centers and Methods For Making The Same;" U.S. Provisional patent Application Ser. No. 60/866, 148, filed Nov. 16, 2006, and entitled "Electroplated High-Resistivity Stabilizers In High Temperature Superconductors And methods Thereof;" U.S. patent application Ser. No. 11/728,108, filed Mar. 23, 2007, and entitled "Systems and Methods For Solution-Based Deposition of Metallic Cap Layers For High Temperature Superconductor Wires;" U.S. Provisional patent application Ser. No. 60/922,145, filed Apr. 6, 2007, and entitled "Composite Substrates For High Temperature Superconductors Having Improved Properties," and U.S. patent application Ser. No. 11/880,586, filed concurrently herewith, entitled "Low Resistance Splice for High Temperature Superconductor Wires."

What is claimed is:

1. A method for forming a superconducting layer, the method comprising:
   providing on a substrate a layer comprising a rare earth element (RE)-alkaline earth-transition metal oxide substantially in a first crystal structure, the RE comprising two or more rare earth cations; and
   heating the layer at a temperature that is greater than 550° C. under oxidizing conditions to form a high-temperature superconducting (HTS) layer substantially in a second crystal structure,
wherein the HTS material has an average stacking fault density that is greater than about 0.01 $nm^{-1}$ and comprises a stoichiometric excess amount of the transition metal element.

2. The method as claimed in claim 1, wherein RE is selected from the group consisting of yttrium, scandium, lanthanum, cerium, praseodymium, neodymium, samarium, europium, gadolinium, terbium, dysprosium, holmium, erbium, thulium, ytterbium, lutetium, and mixtures thereof.

3. The method as claimed in claim 1, wherein the layer comprises (RE)$Ba_2Cu_3O_7$-y, at least one of the RE being yttrium.

4. The method as claimed in claim 3, wherein RE is selected from the group consisting of yttrium, scandium, lanthanum, cerium, praseodymium, neodymium, samarium, europium, gadolinium, terbium, dysprosium, holmium, and mixtures thereof.

5. The method as claimed in claim 3, wherein the first crystal structure is the tetragonal phase and the second crystal phase is the orthorhombic phase.

6. The method as claimed in claim 3, wherein the stacking fault comprises $YBa_2Cu_4O_8$-y type intergrowths.

7. The method as claimed in claim 1, wherein the HTS material comprises a stoichiometric excess amount of at least one RE.

8. The method as claimed in claim 7, wherein layer comprising a rare earth element (RE)-alkaline earth element-transition metal oxide substantially in a first crystal structure comprises nanosized precipitates incorporating a rare earth element.

9. The method as claimed in claim 7, wherein the HTS material has a critical current density ratio, (Ic:H//ab)/(Ic:H//c), of at least 1.8, the ratio being the critical current density measured with magnetic field parallel to the ab-plane of the second crystal structure (Ic:H//ab) and the critical current density measured with magnetic field parallel to the c-axis of the second crystal structure (Ic:H//c).

10. The method as claimed in claim 1, wherein the HTS material has a critical current density ratio, (Ic:H//ab)/(Ic:H//c), from about 1.2 to about 4, the ratio being the critical current density measured with magnetic field parallel to the ab-plane of the second crystal structure (Ic:H//ab) and the critical current density measured with magnetic field parallel to the c-axis of the second crystal structure (Ic:H//c).

11. The method as claimed in claim 1, wherein the transition metal element is copper.

12. The method as claimed in claim 1, wherein the HTS material has an average stacking fault density that is from about 0.015 $nm^{-1}$ to about $0.085^{-1}$.

13. The method as claimed in claim 1, wherein the heating the layer is carried out at a temperature not exceeding 1000° C.

14. The method as claimed in claim 1, wherein the oxidizing condition comprises a substantially pure dry oxygen gas.

15. The method as claimed in claim 1, wherein the substrate comprises nickel, silver, copper, zinc, aluminum, iron, chromium, vanadium, palladium, molybdenum, alloys thereof, and mixtures thereof.

16. The method as claimed in claim 1, wherein the substrate is biaxially textured.

17. The method as claimed in claim 1, wherein at least one buffer layer which comprises a metal oxide is disposed between the substrate and the layer comprising a rare earth element (RE)-alkaline earth-transition metal oxide.

18. The method as claimed in claim 17, wherein the at least one buffer layer comprises $LaAlO_3$, $Y_2O_3$, $CeO_2$, or yttria-stabilized zirconia (YSZ).

19. The method as claimed in claim 17, wherein the at least one buffer layer is an epitaxial buffer layer.

20. The method as claimed in claim 1, wherein the layer in the first crystal structure is obtained by decomposing a layer comprising an oxyfluoride.

21. The method as claimed in claim 20, wherein the layer comprising an oxyfluoride further comprises a metal fluoride.

22. The method as claimed in claim 21, wherein the metal fluoride comprises barium fluoride.

23. A superconducting wire comprising:
a substrate having a superconducting layer disposed thereon, the superconducting layer comprising a rare earth element (RE)-alkaline earth element-transition metal oxide having an average stacking fault density that is greater than about $0.01$ $nm^{-1}$, wherein RE comprises two or more rare earth cations and the superconducting layer comprises a stoichiometric excess amount of the transition metal element.

24. The superconducting wire as claimed in claim 23, wherein RE is selected from the group consisting of yttrium, scandium, lanthanum, cerium, praseodymium, neodymium, samarium, europium, gadolinium, terbium, dysprosium, holmium, erbium, thulium, ytterbium, lutetium, and mixtures thereof.

25. The superconducting wire as claimed in claim 23, wherein the layer comprises $(RE)Ba_2Cu_3O_{7-y}$, at least one RE being yttrium.

26. The superconducting wire as claimed in claim 25, wherein RE is selected from the group consisting of yttrium, scandium, lanthanum, cerium, praseodymium, neodymium, samarium, europium, gadolinium, terbium, dysprosium, holmium, and mixtures thereof.

27. The superconducting wire as claimed in claim 25, wherein the superconducting material is substantially in an orthorhombic phase.

28. The superconducting wire as claimed in claim 25, wherein the stacking fault comprises $YBa_2Cu_4O_{8-y}$ type intergrowths.

29. The superconducting wire as claimed in claim 23, further comprising a stoichiometric excess amount of at least one RE.

30. The superconducting wire as claimed in claim 29, wherein the stoichiometric excess amount of at least one RE forms nanosized precipitates.

31. The superconducting wire as claimed in claim 30, said superconducting wire having a critical current density ratio of at least 1.8, the ratio being the critical current density measured with magnetic field parallel to the ab-plane of the second crystal structure (Ic:H//ab) and the critical current density measured with magnetic field parallel to the c-axis of the second crystal structure (Ic:H//c).

32. The superconducting wire as claimed in claim 23, said superconducting wire having a critical current density ratio from about 1.2 to about 4, the ratio being the critical current density measured with magnetic field parallel to the ab-plane of the second crystal structure (Ic:H//ab) and the critical current density measured with magnetic field parallel to the c-axis of the second crystal structure (Ic:H//c).

33. The superconducting wire as claimed in claim 23, wherein the transition metal element is copper.

34. The superconducting wire as claimed in claim 23, said superconducting wire having an average stacking fault density that is from about $0.015$ $nm^{-1}$ to about $0.085$ $nm^{-1}$.

35. The superconducting wire as claimed in claim 23, wherein the substrate comprises nickel, silver, copper, zinc, aluminum, iron, chromium, vanadium, palladium, molybdenum, alloys thereof, and mixtures thereof.

36. The superconducting wire as claimed in claim 23, wherein the substrate is biaxially textured.

37. The superconducting wire as claimed in claim 23, further comprising at least one buffer layer comprising a metal oxide disposed between the substrate and the superconducting layer.

38. The superconducting wire as claimed in claim 37, wherein the at least one buffer layer comprises $LaAlO_3$, $Y_2O_3$, $CeO_2$, or yttria-stabilized zirconia (YSZ).

39. The superconducting wire as claimed in claim 37, wherein the at least one buffer layer is an epitaxial buffer layer.

40. A superconducting layer produced by
providing a layer comprising a rare earth element (RE)-alkaline earth element transition metal oxide substantially in a first crystal structure;
heating the layer at a temperature that is greater than 550° C. under oxidizing conditions to form a high-temperature superconducting (HTS) material substantially in a second crystal structure; wherein
the RE comprises two or more rare earth cations; and
the HTS material has an average stacking fault density that is greater than about $0.01$ $nm^{-1}$ and comprises a stoichiometric excess amount of the transition metal element.

* * * * *